(12) United States Patent
Lu et al.

(10) Patent No.: US 10,622,971 B2
(45) Date of Patent: Apr. 14, 2020

(54) METHOD AND DEVICE FOR ADJUSTING PASSBAND WIDTH OF FILTER

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Zhenghua Lu, Beijing (CN); Zongze He, Beijing (CN); Jianguang Yang, Beijing (CN); Shuo Li, Beijing (CN); Zhipeng Feng, Beijing (CN); Liang Zhang, Beijing (CN); Yuxuan Chen, Beijing (CN); Feng Long, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/092,078

(22) PCT Filed: Jan. 4, 2018

(86) PCT No.: PCT/CN2018/071295
§ 371 (c)(1),
(2) Date: Oct. 8, 2018

(87) PCT Pub. No.: WO2018/227952
PCT Pub. Date: Dec. 20, 2018

(65) Prior Publication Data
US 2019/0245522 A1 Aug. 8, 2019

(30) Foreign Application Priority Data
Jun. 14, 2017 (CN) .......................... 2017 1 0446111

(51) Int. Cl.
| | | |
|---|---|---|
| H03H 17/02 | (2006.01) |
| H03H 11/12 | (2006.01) |
| G06K 9/00 | (2006.01) |

(52) U.S. Cl.
CPC ....... *H03H 17/0294* (2013.01); *G06K 9/0051* (2013.01); *H03H 11/1217* (2013.01);
(Continued)

(58) Field of Classification Search
CPC .................................................. H03H 17/0294
(Continued)

(56) References Cited

U.S. PATENT DOCUMENTS

2010/0121610 A1* 5/2010 Hsu .................... A61B 5/04017
702/189

FOREIGN PATENT DOCUMENTS

| CN | 1758536 A | 4/2006 |
|---|---|---|
| CN | 101841074 | 9/2010 |

(Continued)

OTHER PUBLICATIONS

PCT International Search Report, Application No. PCT/CN2018/071295, dated Apr. 12, 2018, 6 pages: with English translation.
(Continued)

*Primary Examiner* — Tan V Mai
(74) *Attorney, Agent, or Firm* — Armstrong Teasdale, LLP

(57) ABSTRACT

The embodiments of the present disclosure provide a method and system for adjusting a passband width of a filter.
(Continued)

The method includes determining an initial passband width, controlling a filter according to the initial passband width to filter signals to be processed, and correcting the initial passband width according to a first frequency at which a peak spectrum line corresponding to the filtered signals is located.

15 Claims, 7 Drawing Sheets

(52) U.S. Cl.
CPC . *H03H 11/1286* (2013.01); *H03H 2017/0298* (2013.01); *H03H 2210/015* (2013.01)

(58) Field of Classification Search
USPC .......................................... 708/305
See application file for complete search history.

(56) References Cited

FOREIGN PATENT DOCUMENTS

| CN | 101846815 A | 9/2010 |
|---|---|---|
| CN | 102308483 | 1/2012 |
| CN | 103944592 A | 7/2014 |
| CN | 103986529 A | 8/2014 |
| CN | 105187131 A | 12/2015 |
| CN | 107038437 A | 8/2017 |

OTHER PUBLICATIONS

PCT Written Opinion, Application No. PCT/CN2018/071295, dated Apr. 12, 2018, 5 pages.: with English translation of relevant part.
China First Office Action, Application No. 201710446111.9, dated Apr. 26, 2019, 21 pps.: with English translation.
Ed. Ming-Yi Chen, Practical Course in Curriculum Design of Electronic Technology [M], 3rd Edition, Changsha: Central South University Press, p. 214, Jan. 2010.: with English translation.

* cited by examiner

METHOD AND DEVICE FOR ADJUSTING PASSBAND WIDTH OF FILTER

CROSS REFERENCE TO RELATED APPLICATIONS

This patent application is a National Stage Entry of PCT/CN2018/071295 filed on Jan. 4, 2018, which claims the benefit and priority of Chinese Patent Application No. 201710446111.9 filed on Jun. 14, 2017, the disclosures of which are incorporated herein by reference in their entirety as part of the present application.

BACKGROUND

The present disclosure relates to the field of information processing technologies, and in particular, to a method and device for adjusting a passband width of a filter.

With the continuous development of information processing technologies and filtering technologies, requirement for filter performance is increasingly improved. In order to obtain a higher signal-to-noise ratio, it is necessary to shrink the passband width of a filter to some extent. For a narrow bandwidth, a dynamically variable filter is usually required, to set the center frequency near the spectrum line of effective signals.

BRIEF DESCRIPTION

Provided in the embodiments of the present disclosure are a method and device for adjusting a passband width of a filter.

A first aspect of the present disclosure provides a method for adjusting a passband width of a filter. The method includes determining an initial passband width, controlling the filter according to the initial passband width to filter signals to be processed, and correcting the initial passband width according to a first frequency at which a peak spectrum line corresponding to the filtered signals is located.

In an embodiment of the present disclosure, correcting the initial passband width includes when the first frequency is within a range of the initial passband width, determining a center frequency of the corrected passband according to the first frequency, or when the first frequency is not within the initial passband width range, filtering the signals to be processed again with a new initial passband width. The initial passband width and the new initial passband width do not have an overlapped bandwidth region.

In an embodiment of the present disclosure, the method further includes filtering the signals to be processed with the corrected passband width, and in response to determining that a second frequency at which the peak spectrum line corresponding to the filtered signals is located is different from the first frequency, correcting the center frequency of the corrected passband according to the second frequency.

In an embodiment of the present disclosure, controlling the filter according to the initial passband width to filter the signals to be processed includes determining a target frequency pin of the filter according to the initial passband width, and enabling the target frequency pin, such that the filter operate at the initial passband width.

In an embodiment of the present disclosure, enabling the target frequency pin includes enabling the target frequency pin of the filter through a target interface, corresponding to the target frequency pin, in a bus extender.

A second aspect of the present disclosure provides a device for adjusting a passband width of a filter. The device includes a filter and a controller. The controller is configured to determine an initial passband width, control a filter according to the initial passband width, to filter signals to be processed, and correct the initial passband width according to the first frequency at which a peak spectrum line corresponding to the filtered signals is located.

In an embodiment of the present disclosure, the controller is further configured to determine a center frequency of the corrected passband according to the first frequency when the first frequency is within the initial passband width range, or filter the signals to be processed again with a new initial passband width when the first frequency is not within the initial passband width range. The initial passband width and the new initial passband width do not have an overlapped bandwidth region.

In an embodiment of the present disclosure, the controller is further configured to filter the signals to be processed with the corrected passband width, and in response to determining that a second frequency at which the peak spectrum line corresponding to the filtered signals is located is different from the first frequency, correct the center frequency of the corrected passband according to the second frequency.

In an embodiment of the present disclosure, the controller is further configured to determine a target frequency pin of the filter according to the initial passband width, and enable the target frequency pin, such that the filter operate at the initial passband width.

In an embodiment of the present disclosure, the device further includes a bus extender. The controller is further configured to enable the target frequency pin of the filter by turning on a target interface, corresponding to the target frequency pin, in the bus extender.

A third aspect of the present disclosure provides an apparatus for adjusting a passband width of a filter. The apparatus includes a processor and a memory. The processor runs a program corresponding to an executable program code stored in the memory by reading the executable program code, to implement the method for adjusting a passband width of a filter proposed in the embodiment of the first aspect described above.

A fourth aspect of the present disclosure provides a computer program product. Instructions in the computer program product, when executed by a processor, execute the method for adjusting a passband width of a filter proposed in the embodiment of the first aspect of the present disclosure described above.

A fifth aspect of the present disclosure provides a non-transitory computer readable storage medium. A computer program is stored on the non-transitory computer readable storage medium, wherein the computer program, when executed by a processor, implements the method for adjusting a passband width of a filter proposed in the embodiment of the first aspect described above.

The additional aspects and advantages of the present disclosure will be set forth in part in the following description, and will become apparent in part from the following description, or will be understood by practicing the present disclosure.

BRIEF DESCRIPTION OF THE DRAWINGS

In order to more clearly illustrate the technical solution of the present disclosure, the drawings accompanying the embodiments will be briefly described below. It should be appreciated that the drawings described below are merely concerning some of the embodiments of the present disclosure, rather than limiting the present disclosure, in which.

DETAILED DESCRIPTION

Figure 1:
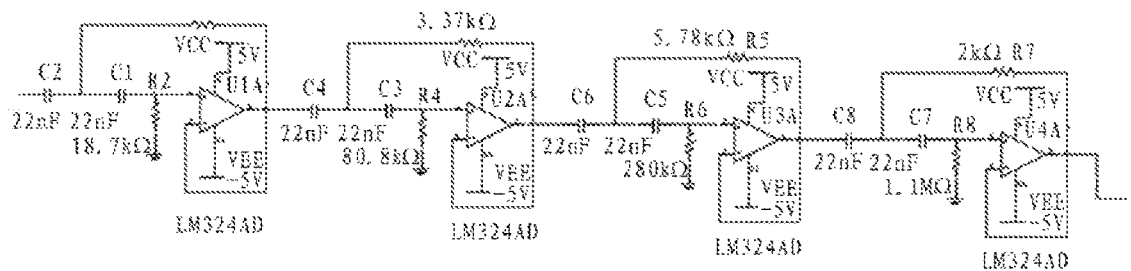
FIG. 1 is a schematic diagram of a filter circuit.

Embodiments of the present disclosure are described in detail below, and examples of the embodiments are illustrated in the drawings, wherein the same or similar reference signs are used throughout the text to refer to the same or similar elements or elements having the same or similar functions. The embodiments described below with reference to the accompanying drawings are illustrative, intended to explain the present disclosure, and cannot be construed as limiting.

At present, filtering is mainly performed using hardware circuits including devices such as operational amplifiers, resistors, and capacitors. For example, FIG. 1 is a schematic diagram of a filter circuit. Referring to FIG. 1, the filter mainly includes a fourth-order Chebyshev high-pass filter and a fourth-order Chebyshev low-pass filter. Since the filter circuit includes four operational amplifiers and a large number of capacitors and resistors, the circuit is relatively complex, and filter parameters can only be changed by welding resistors and capacitors manually.

Therefore, in situations where a high signal-to-noise ratio is required, the frequency of effective signals changes frequently, or the measurement range needs to be changed in real time, for example, a frequency modulation circuit or a sensor circuit and the like, it has poor filtering effects that it can hardly obtain effective signals due to interference noise.

When the above hardware circuits are used for filtering, it is difficult to dynamically change filter parameters of the filter. The steps to change filter parameters are cumbersome and complex.

Embodiments of the present disclosure determine an initial passband width according to the type of signals to be processed. Then the initial passband width can be corrected according to a specific peak value of the filtered spectrum line. Therefore, the corrected passband width has a range as narrow as possible on the basis of containing effective signals. This effectively improves the signal-to-noise ratio of the filter and significantly improves filtering effects.

The method and device for adjusting a passband width of a filter of the embodiments of the present disclosure will be described below with reference to the accompanying drawings.

Figure 2:
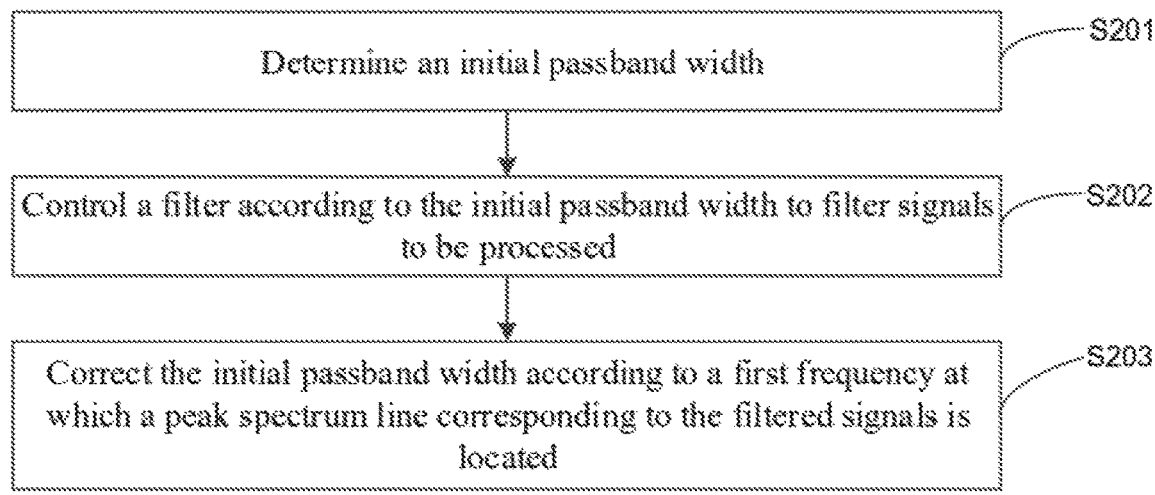
FIG. 2 is a schematic flowchart of a method for adjusting a passband width of a filter according to an embodiment of the present disclosure.

FIG. 2 is a schematic flowchart of a method for adjusting a passband width of a filter according to an embodiment of the present disclosure. The following description is given by example of a programmable filter, however, other filters, of which the filter parameters can be dynamically changed, can also be used according to actual needs.

As shown in FIG. 2, the method includes the following steps.

In step S201, an initial passband width can be determined.

The method for adjusting a passband width of a filter provided by the embodiments of the present disclosure can be implemented by any controller. The controller is configured to control the operation state of the programmable filter, which is for example a digital signal processor (DSP), a field programmable gate array (FPGA), an ARM, a microcontroller, etc.

Further, since a DSP has a wealth of integrated analog to digital converter (ADC) and multiplier resources. Compared to a microcontroller, an FPGA, or an ARM, the DSP can more easily and quickly sample and process signals. Therefore, when the controller is a DSP, the complexity of the circuit can be effectively reduced.

In an embodiment of the present disclosure, the initial passband width may be determined according to an attribute of signals to be processed, such as the type of the signals to be processed, or a usage scenario of the programmable filter. For example, for steel mills, different steel mills may have different corresponding initial passband widths. Therefore, the initial passband width can be determined based on a steel mill to which the programmable filter belongs.

In step S202, the filter can be controlled according to the initial passband width, to filter the signals to be processed.

Figure 3A:
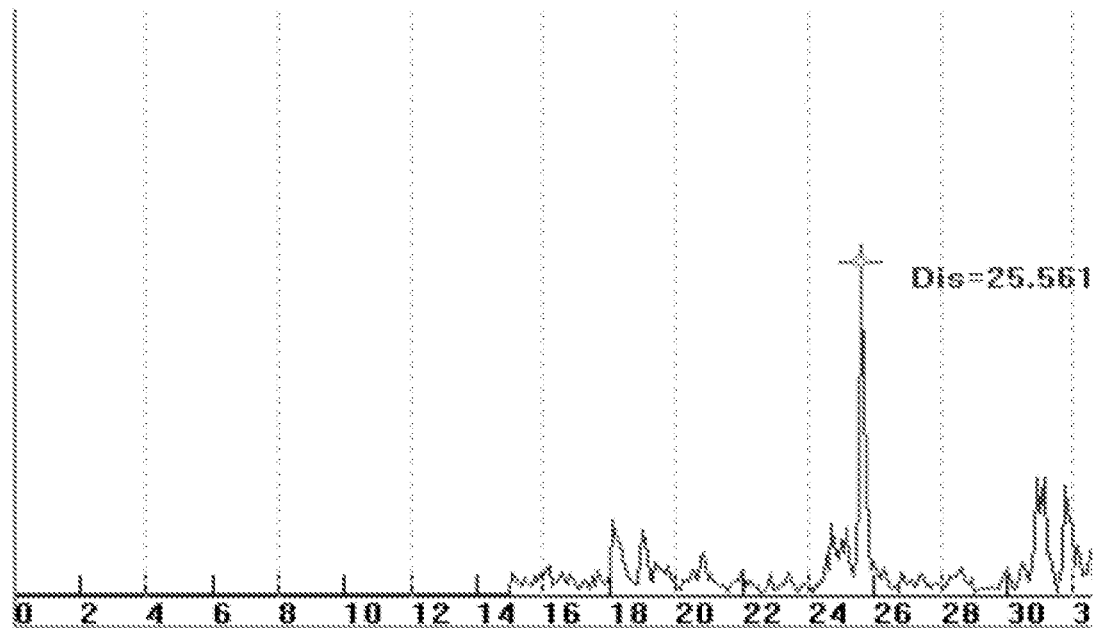
FIGS. 3A and 3B are schematic diagrams showing dynamic changes of an amplitude spectrum line of consecutive frequency modulated signals subjected to FFT processing according to an embodiment of the present disclosure.
Figure 3B:
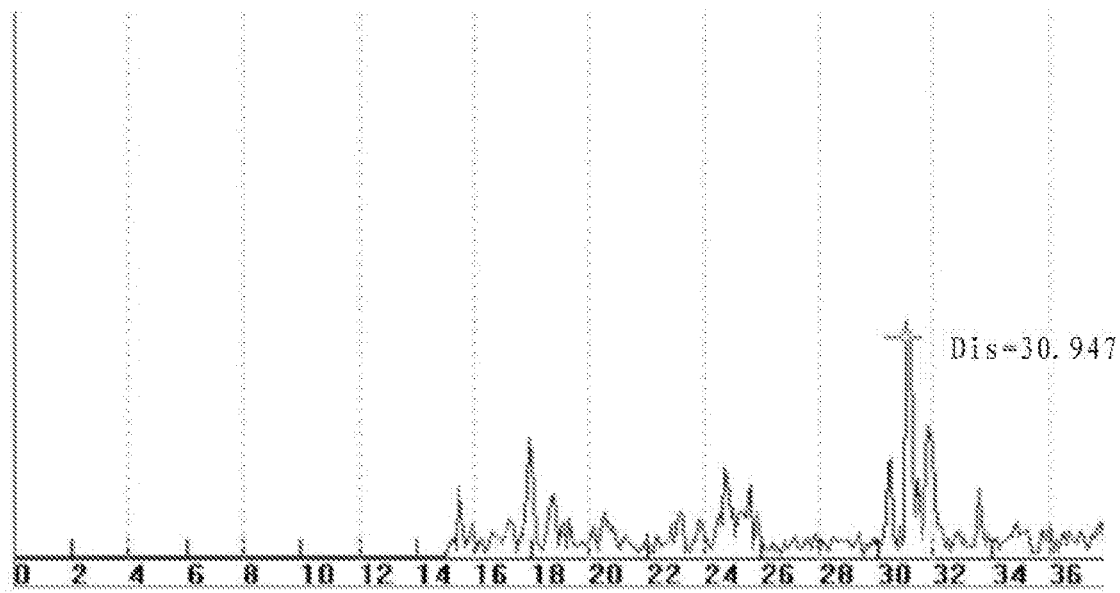

Taking consecutive frequency modulated waves as an example, before frequency modulation, modulated signals may include a large amount of environmental noise interference, and will vary within a certain frequency range in the frequency domain. Referring to FIGS. 3A and 3B, FIGS. 3A and 3B show schematic diagrams showing dynamic changes of an amplitude spectrum line of consecutive frequency modulated signals subjected to Fast Fourier Transform (FFT) processing. As can be seen from FIGS. 3A and 3B, for demodulated signals, due to different measurement environments, useful signals (i.e., the highest spectrum line in FIGS. 3A and 3B) dynamically change in the frequency domain, and a large amount of interference noise exists in a certain frequency range.

After demodulation, it is necessary to suppress not only the frequency of the carrier frequency band but also the interference noise near the effective signals. An embodiment of the present disclosure can be implement with a band-pass filter, of which the passband width can be dynamically changed, of which the center frequency overlaps with the spectrum line of the useful signals as much as possible, and of which the cut-off frequency is located on both sides of the spectrum line and close to the spectrum line as much as possible. In this way, the useful signals are amplified as much as possible, and the noise frequency outside the passband is suppressed, thereby improving the signal-to-noise ratio.

In order to effectively track the useful signals among the signals to be processed, the programmable filter can be controlled according to the initial passband width to filter the signals to be processed to determine the useful signals contained therein. Specifically, different frequency division circuits of the programmable filter can be controlled to operate, to control the programmable filter to operate at different passband widths.

The center frequency and operation mode of the programmable filter can be selected through a pin input. After the initial passband width is determined, the target frequency pin of the programmable filter can be determined according to the initial passband width. The target frequency pin is then enabled, such that the programmable filter can operate at the initial passband width to filter out the useful signals.

Figure 4:
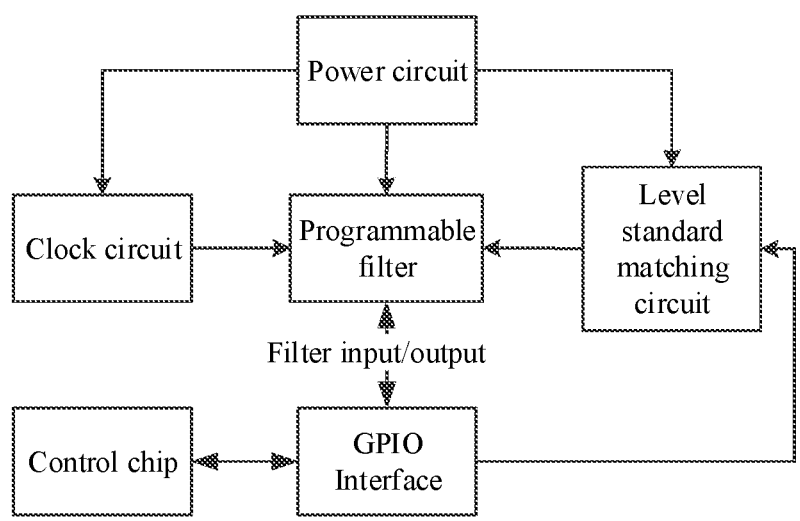
FIG. 4 is a schematic structural diagram of a programmable filter circuit according to an embodiment of the present disclosure.

FIG. 4 is a schematic structural diagram of a device for adjusting a passband width of a filter in an embodiment of the present disclosure. Referring to FIG. 4, a GPIO interface is a General Purpose Input/Output interface, or a bus extender. The controller can enable the target frequency pin of the programmable filter through a target interface corresponding to the target frequency pin in the GPIO interface.

As an example, the programmable filter has a total of 24 pins, including a five-bit input F[4:0], a seven-bit input Q[6:0], a clock input, and so on. After the target frequency pin of the programmable filter is determined according to the initial passband width, the target frequency pin of the programmable filter can be enabled, by configuring the values of F[4:0] and Q[6:0].

Controlling the programmable filter using a bus extender can increase the scalability of the device. By enabling the frequency pin of the programmable filter, the filter bandwidth of the programmable filter can be adjusted, thus the implementation method is simple. As the programmable filter can be flexibly controlled to operate at different passband widths, it is applicable for signal adjustment, sampling and processing in frequency modulation circuits and sensor circuits.

It should be understood that the programmable filter in the embodiments of the present disclosure can be an analog filter. Unlike an adaptive digital filter, an analog filter can be applied prior to signal ADC sampling, and can be implemented by processing analog signals. The digital filter is applied after sampling and quantization and is implemented by processing digital signals. Since a large number of noise signals are contained in the signals to be processed, effective signals cannot be effectively identified only by digital filtering. Therefore, analog filtering is a prerequisite for digital filtering with respect to devices with large noise and dynamic changes in useful signals.

In addition, after the signals to be processed are filtered, it is also necessary, during the determination of the peak spectrum line of the signals to be processed, to use the prior art to perform sampling and FFT processing of the filtered signals to be processed, to obtain the frequency spectrum line of the signals to be processed.

In step S203, the initial passband width can be corrected according to the first frequency at which the peak spectrum line corresponding to the filtered signals is located.

The peak spectrum line corresponding to the filtered signals is the useful signals among the signals to be processed. Therefore, the initial passband width can be corrected according to the first frequency at which the peak spectrum line corresponding to the filtered signals is located, so that the corrected passband can effectively suppress interference signals near the effective signals and the frequency of the carrier segment. In this way, the useful signals can be amplified as much as possible, and the noise frequency outside the passband can be suppressed, thereby improving the signal-to-noise ratio.

Since the first frequency may be within the initial passband width and may also be outside the initial passband width, the above step S203 specifically includes when the first frequency is within the initial passband width range, determining the center frequency of the corrected passband according to the first frequency. On the other hand, the above step S203 specifically also include when the first frequency is not within the initial passband width range, filtering the signals to be processed again with a new initial passband width. The initial passband width and the new initial passband width do not have an overlapped bandwidth region.

For example, for the first frequency being $F_1$, in the case that the first frequency F1 is within the initial passband width range, it can be determined that the center frequency of the corrected passband is $F_1$, and the cut-off frequency is located on both sides of the center frequency $F_1$ and close to the center frequency $F_1$ as much as possible. Therefore, it is possible to mark a value $\Delta F$ which is as small as possible, the cut-off frequency is $F_1-\Delta F$ or $F_1+\Delta F$, and the passband width is $2\Delta F$.

In addition, in the case that the first frequency $F_1$ is not within the initial passband width range, the peak spectrum line corresponding to the first frequency $F_1$ is interference signals in a fixed environment. Thus, the signals to be processed can be re-filtered with a new initial passband width. The initial passband width and the new initial passband width do not have an overlapped bandwidth region. Thereafter, the signals to be processed are filtered with the corrected passband width, that is, the procedure returns to step S201, to correct the passband width in a corrected speed as soon as possible.

In the filter passband width adjustment method of the embodiment, the initial passband width is first determined, then the signals to be processed are filtered using the determined initial passband width, and next the initial passband width is corrected according to the specific filtered spectrum line peak. Thus, the adjustment of the passband width of the filter can be implemented according to the specific spectrum line peak of the signals to be processed, improving the signal-to-noise ratio of the filter, and improving the filtering effects of the filter.

In the embodiments of the present disclosure, it provides a method for adjusting a passband width of a filter to adjust a passband width of a filter according to a specific spectrum line peak of signals to be processed, thereby improving the signal-to-noise ratio of the filter, improving the filtering effects of the filter. Hence it solves the problem that, in existing steps, a hardware structure constructed with operational amplifiers, resistors and capacitors for filtering and changing filtering parameters are very cumbersome and complex, which is impossible to dynamically change the filtering parameters of the filter.

As can be seen from the above analysis, when the first frequency at which the peak spectrum line of the signals to be processed are located is within the initial passband width, the first frequency can be configured as the center frequency of the corrected passband, and then the signals to be processed can be filtered using the corrected passband. In a specific implementation, if the frequency at which the peak spectrum line is located of the signals to be processed is varying, the passband width of the filter can be corrected in real time according to the variation of the frequency at which the peak spectrum line of the signals to be processed is located. The above situation will be described in detail below with reference to FIG. 5.

Figure 5:
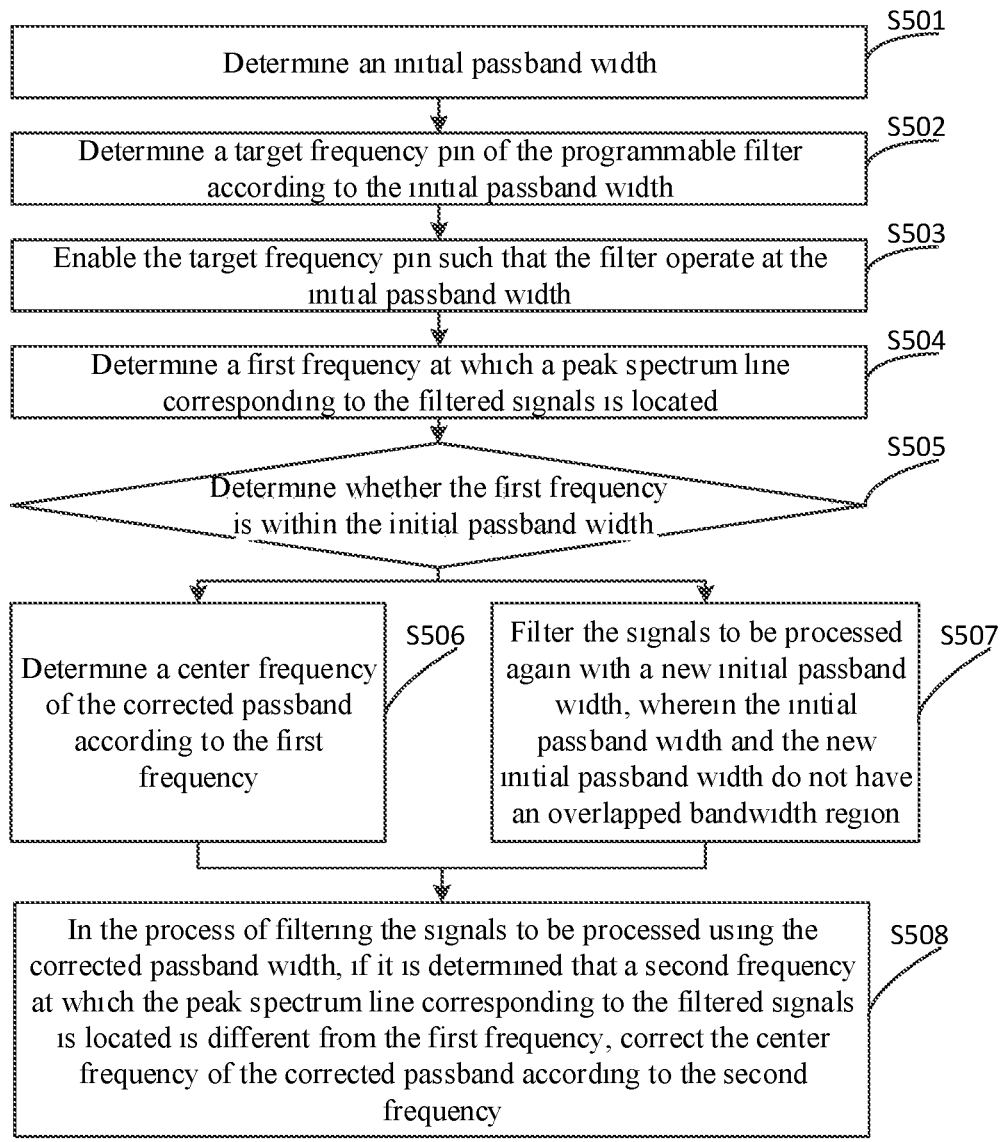
FIG. 5 is a schematic flowchart of another method for adjusting a passband width of a filter according to an embodiment of the present disclosure.

FIG. 5 is a schematic flowchart of another method for adjusting a passband width of a filter according to an embodiment of the present disclosure. Referring to FIG. 5, the method includes the following steps.

S501, an initial passband width can be determined. The execution process of step S501 may refer to the related description of step S201 in the foregoing embodiment, and the details thereof are omitted herein.

S502, a target frequency pin of the programmable filter can be determined according to the initial passband width.

S503, the target frequency pin can be enabled so that the programmable filter operates at the initial passband width.

Specifically, the target frequency pin of the programmable filter can be enabled by a target interface in the bus extender corresponding to the target frequency pin. For example, referring to FIG. 4, the controller can enable the target frequency pin of the programmable filter by turning on a GPIO interface corresponding to the target frequency pin.

In a possible implementation form of the present application, in order for more flexible filtering control, the embodiment of the present disclosure can use a host computer to communicate with a DSP, change the program of the controller through host computer instructions, and then dynamically change the filtering parameters of the filter.

Specifically, for the controller being a DSP, the host computer can dynamically change the filter parameters of the filter through C language programming. For example, all programs can be written in a while(1) cycle. Since the process of assigning the GPIO interface with value takes a long time, in order to optimize the running time of the main program, the entire communication procedure can be divided into two sections, code 1 and code 2. The code 1 is configured to assign the host computer with an indicator, and the code 2 is configured to detect changes in the indicator, enable the corresponding code and configure an external GPIO interface, wherein the indicator is configured to indicate the current passband width.

Figure 6:
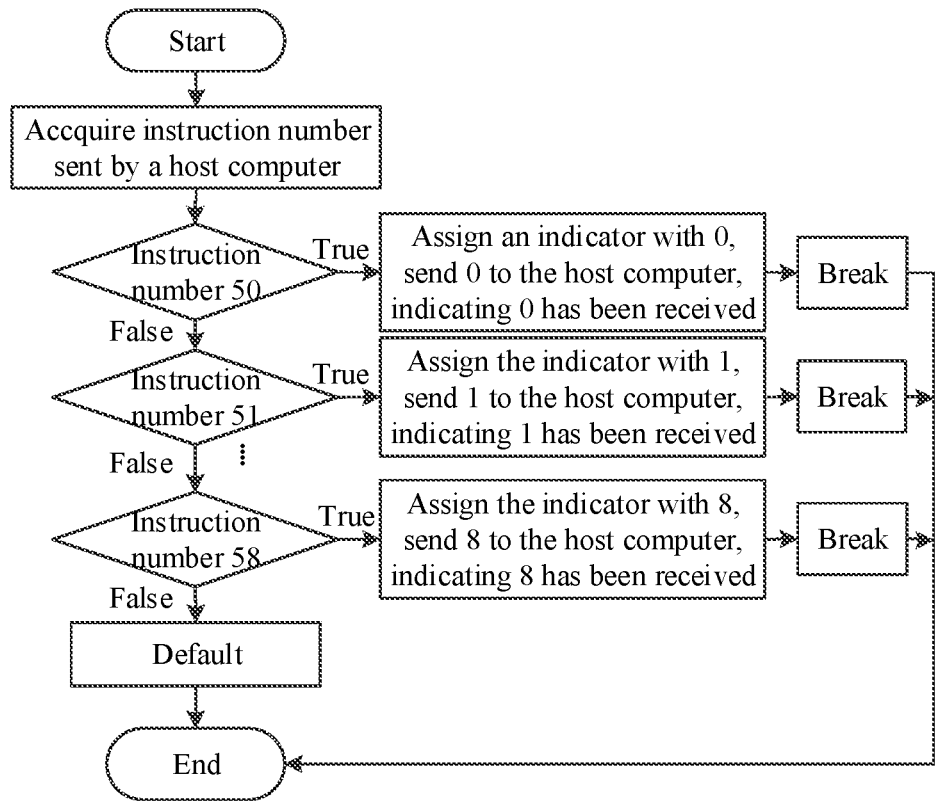
FIG. 6 is a schematic flowchart of a host computer communicating with a DSP according to an embodiment of the present disclosure.

According to the code 1, the host computer can communicate with the DSP using a CAN bus, and assign values to a certain indicator m in a corresponding communication mailbox through different instruction numbers. Further, after the DSP assigns a value to the indicator m, a feedback can be given to the host computer to inform the host computer that the assigned quantity has been received. Referring to FIG. 6, it shows a schematic flowchart of a host computer communicating with a DSP according to an embodiment of the present disclosure.

Figure 7:
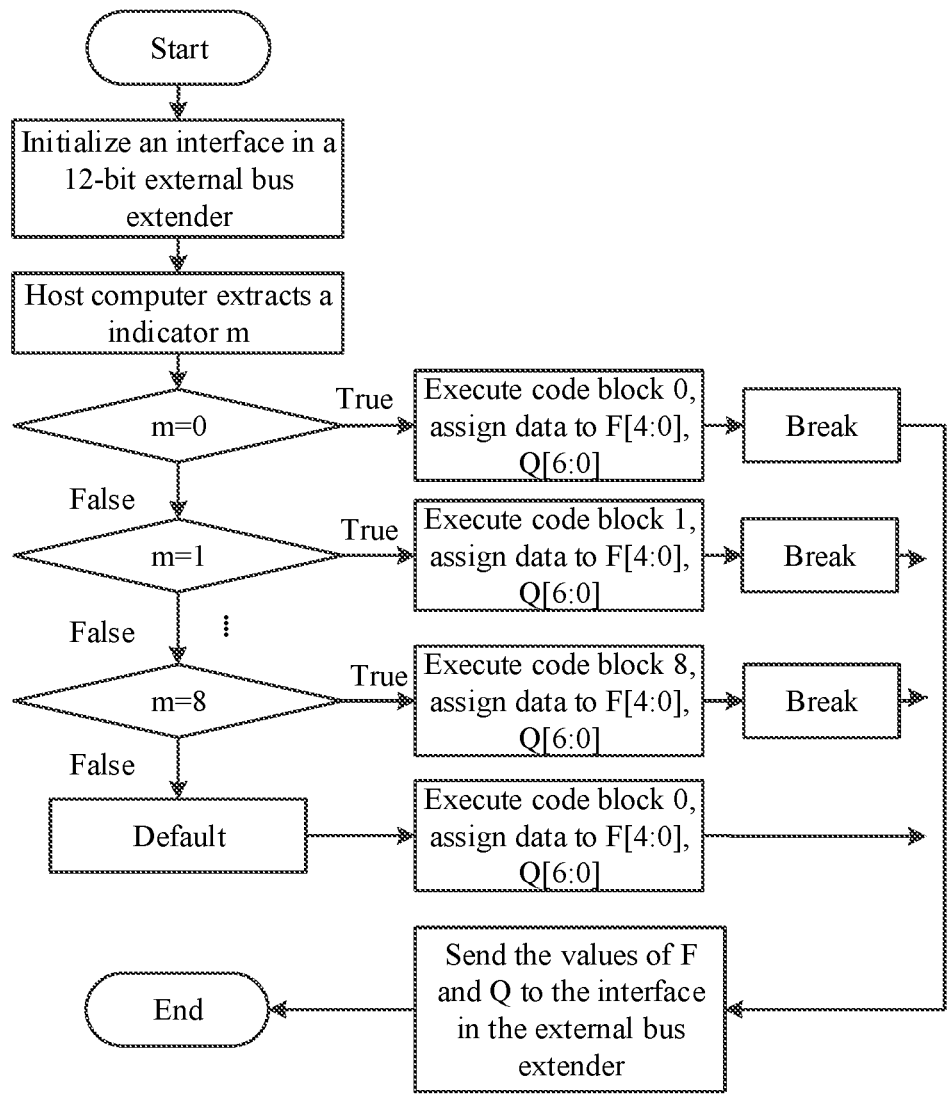
FIG. 7 is a schematic flowchart of the DSP configuring the programmable filter according to an embodiment of the present disclosure.

According to the code 2, the DSP can configure the programmable filter through a switch statement. Specifically, taking m as the determination condition, in response to the value of m unchanged, it jumps out; in response to the value of m changed, the changed value of m can enable a corresponding program and run the code block in the corresponding case statement to configure the external GPIO interface. For example, referring to FIG. 7, it is a schematic flowchart of the DSP configuring the programmable filter chip according to an embodiment of the present disclosure. When m=8, code block 8 is executed, F[4:0] and Q[6:0] are assigned with values. Then the values of F[4:0] and Q[6:0] are sent to the external GPIO interface, that is, the external GPIO interface is configured, and the target frequency pin of the programmable filter is enabled, so that the programmable filter operates at the initial passband width.

S504, a first frequency at which the peak spectrum line corresponding to the filtered signals is located can be determined.

It should be noted that, after the signals to be processed are filtered, it is also necessary, during the determination of the peak spectrum line of the signals to be processed, to perform sampling and FFT processing of the filtered signals to be processed, to obtain the frequency spectrum line of the signals to be processed.

It can be understood that the peak spectrum line corresponding to the filtered signals is the useful signals among the signals to be processed. Therefore, the initial passband width can be corrected according to the first frequency at which the peak spectrum line corresponding to the filtered signals is located, to effectively suppress the interference signals near the effective signals and the frequency of the carrier segment, thereby amplifying the useful signals as much as possible, suppressing the noise frequency outside the passband, and further improving the signal-to-noise ratio.

S505, it is determined whether the first frequency is within the initial passband width range. If so, execute S506. Otherwise, execute S507.

The first frequency may be within or outside the initial passband width. Therefore, it is determined whether the first frequency is within the initial passband width range, and different schemes can be used to correct the initial passband width according to the position at which the first frequency is located, thereby correcting the passband as quickly as possible.

S506, the center frequency of the corrected passband can be determined according to the first frequency.

S507, the signals to be processed can be filtered again with a new initial passband width. The initial passband width and the new initial passband width do not have an overlapped bandwidth region.

Specifically, the signals to be processed can be filtered again with a new initial passband width. The procedure returns to step S501, the initial passband width can be determined again, and subsequent steps can be executed to correct the passband width as fast as possible.

S508, in the process of filtering the signals to be processed using the corrected passband width, in response to determining that a second frequency at which the peak spectrum line corresponding to the filtered signals is located is different from the first frequency, correcting the center frequency of the corrected passband according to the second frequency.

In a specific implementation, the frequency at which the peak spectrum line of the signals to be processed is located may vary. For example, the frequency of effective signals of a frequency modulation circuit or a sensor circuit varies frequently, or the measurement range needs to be changed in real time. Thus the useful signal, which is the peak spectrum line corresponding to the filtered signal, need to be tracked in real time. Therefore, in response to determining that a second frequency at which the peak spectrum line corresponding to the filtered signals is located is different from the first frequency, it is necessary to correct the center frequency of the corrected passband according to the second frequency, thereby maintaining the signal-to-noise ratio of the filter for a high value at any time.

Specifically, when the second frequency is within the corrected passband width range, the center frequency of the new corrected passband can be determined according to the second frequency. Alternatively, when the second frequency is not within the corrected passband width range, the signals to be processed can be filtered again with a new initial passband width. The new initial passband width and the corrected passband width do not have an overlapped bandwidth region. It can effectively track the useful signals among the signals to be processed, and then select a suitable passband width to obtain signals with a high signal-to-noise ratio.

In the method for adjusting a passband width of a filter in this embodiment, the target frequency pin of the programmable filter can be determined according to the initial passband width, and the target frequency pin can be enabled so that the programmable filter can operate at the initial passband width. Therefore, it effectively improves the scalability of the device and simply implemented. By determining the first frequency at which the peak spectrum line corresponding to the filtered signals is located, it determines the center frequency of the corrected passband according to the first frequency when the first frequency is within the initial passband width range, and filters the signals to be processed again with a new initial passband width when the first frequency is not within the initial passband width range, thereby correcting the passband width as fast as possible. By filtering the signals to be processed using the corrected passband width, in response to determining that a second frequency at which the peak spectrum line corresponding to the filtered signals is located is different from the first frequency, it corrects the center frequency of the corrected passband according to the second frequency. Therefore, it can maintain the signal-to-noise ratio of the filter at a high value at any time, thereby effectively improving filtering effects.

Figure 8:
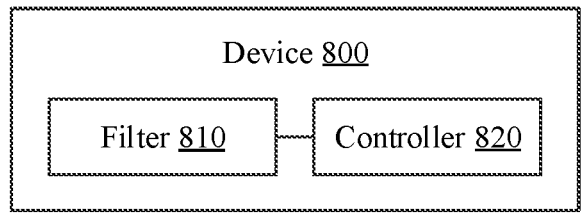
FIG. 8 is a schematic structural diagram of a device for adjusting a passband width of a filter according to an embodiment of the present disclosure.

FIG. 8 is a schematic structural diagram of a device 800 for adjusting a passband width of a filter according to an embodiment of the present disclosure.

As shown in FIG. 8, the device 800 includes a filter 810 and a controller 820.

The controller 820 is configured to determine an initial passband width, control the filter 810 according to the initial passband width to filter signals to be processed, and correct the initial passband width according to a first frequency at which the peak spectrum line corresponding to the filtered signals is located. The controller 820 can be any processing chip with an operation function, such as a DSP, an FPGA, or the like.

In an embodiment of the present disclosure, the controller 820 is further configured to determine the center frequency of the corrected passband according to the first frequency when the first frequency is within the initial passband width range. Alternatively, the controller 820 is also configured to filter the signals to be processed again with a new initial passband width when the first frequency is not within the initial passband width. The initial passband width and the new initial passband width do not have an overlapped bandwidth region.

In order to further improve the signal-to-noise ratio of the programmable filter, the controller 820 may be further configured to correct the center frequency of the corrected passband according to the second frequency, in response to determining that a second frequency at which the peak spectrum line corresponding to the filtered signals is located is different from the first frequency, during the process of filtering the signals to be processed using the corrected passband width.

In addition, different frequency divider circuits of the programmable filter can be controlled to work so as to control the programmable filter to operate at different passband widths. Thus, the controller 820 can be configured to determine a target frequency pin of the programmable filter 810 according to the initial passband width, and enable the target frequency pin such that the programmable filter 810 can operate at the initial passband width.

Figure 9:
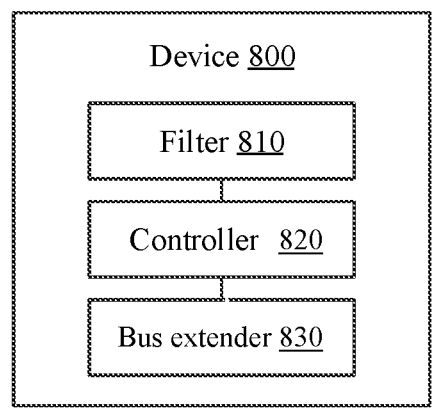
FIG. 9 is a schematic structural diagram of another device for adjusting a passband width of a filter according to an embodiment of the present disclosure.

In an embodiment of the present disclosure, on the basis of FIG. 8, referring to FIG. 9, the device 800 may further include a bus extender 830. The controller 820 is further configured to enable the target frequency pin of the programmable filter 810 by turning on a target interface in the bus extender 830 corresponding to the target frequency pin.

It should be noted that the foregoing explanation and description of the embodiment with respect to the method for adjusting a passband width of a filter of the embodiment of FIGS. 1-7 is also applicable to the device 800 for adjusting a passband width of a filter of this embodiment, and will not be repeated herein.

The device for adjusting a passband width of a filter in the embodiment firstly determines an initial passband width, then filters signals to be processed using the determined initial passband width, and corrects the initial passband width according to a specific peak value of filtered spectrum line. Thus, the passband width of the filter can be adjusted, according to the specific peak value of the spectrum line of the signals to be processed. Therefore, the signal-to-noise ratio of the filter is improved, and the filtering effects of the filter are improved.

The embodiments of the present disclosure further provide a device for adjusting a passband width of a filter. The device includes a processor and a memory. Computer program instructions stored on the memory, when executed by the processor, cause the device to implement the method for adjusting a passband width of a filter as described in the previous embodiments.

The embodiments of the present disclosure further provide a computer program product. Instructions in the computer program product, when executed by a processor, perform the method for adjusting a passband width of a filter in the above embodiments of the present disclosure.

The embodiments of the present disclosure further provide a non-transitory computer readable storage medium having a computer program stored thereon. The computer program, when executed by a processor, implements the method for adjusting a passband width of a filter as described in the previous embodiments.

In the description of the present specification, the description with reference to the terms "one embodiment", "some embodiments", "example", "specific example", or "some examples" and the like means the specific feature(s), structure(s), material(s), or characteristics described in connection with the embodiment(s) or example(s) is(are) included in at least one embodiment or example of the present disclosure. In the present description, the schematic representation of the above terms is not necessarily directed to the same embodiment or example. Furthermore, the specific feature(s), structure(s), material(s), or characteristics described may be combined in a suitable manner in any one or more embodiments or examples. In addition, those skilled in the art may incorporate and combine different embodiments or examples described in the description, as well as features of different embodiments or examples without no contradiction.

Moreover, the terms "first" and "second" are used for descriptive purposes only and may not be construed as indicating or implying a relative importance or implicitly indicating the number of technical features indicated. Thus, features defined by "first" or "second" may include at least one of the features, either explicitly or implicitly. In the description of the present disclosure, the meaning of "a plurality" is at least two, such as two, three, etc., unless specifically defined otherwise.

Any process or method in the flowchart or otherwise described herein may be understood to represent a module, segment or part including code of executable instructions of one or more steps for implementing the customized logic function or process, The scope of the embodiments of the present disclosure includes an additional implementation in which the functions may be performed in a substantially simultaneous manner or in other order depending on the functions involved, rather than the order shown or discussed, and this should be understood by those skilled in the art to which the embodiments of the present disclosure pertain.

The logic and/or steps represented in the flowchart or otherwise described herein, for example, an ordering list that may be considered as executable instructions for implementing logical functions, may be embodied in any computer readable medium, for use in or use in conjunction with an instruction execution system, device or apparatus (e.g., a computer-based system, a system including a processor, or other systems that can extract instructions from an instruction execution system, device or apparatus and execute instructions). For the description, a "computer-readable medium" can be any device that can contain, store, communicate, propagate, or transport a program for use in or use in conjunction with an instruction execution system, device or apparatus. More specific examples (non-exhaustive) of the computer readable medium include an electrical connection (an electronic device) having one or more wires, a portable computer disk cassette (a magnetic device), a random access memory (RAM), a read only memory (ROM), an erasable editable read only memory (EPROM or flash memory), an optic fiber device, and a portable compact disk read only memory (CDROM). In addition, the computer readable medium may even be paper or other suitable medium on which the program can be printed, as the program may be electronically obtained for example by optically scanning and then editing and interpretating or, if appropriate, processing in another suitable manner the paper or other medium, and then is stored in a computer memory.

It should be understood that portions of the present disclosure can be implemented in hardware, software, firmware, or a combination thereof. In the above-described embodiments, multiple steps or methods may be implemented in software or firmware stored in a memory and executed by a suitable instruction execution system. For example, if implemented in hardware and in another embodiment, the steps or methods can be implemented by any one or combination of the following techniques known in the art: a discrete logic circuit with a logic gate circuit for implementing a logic function on data signals, an application specific integrated circuit with a suitable combinational logic gate circuit, a programmable gate array (PGA), a field programmable gate array (FPGA), and the like.

Those of ordinary skills in the art can understand that all or part of the steps carried by the method of the above embodiments can be completed by a program which instructs related hardware, and the program can be stored in a computer readable storage medium. When executed, the program includes one of the steps of the method embodiments or a combination thereof.

In addition, functional units in various embodiments of the present disclosure may be integrated into one processing module, and may also exist physically separately, or two or more of the units may be integrated into one module. The integrated module can be implemented in the form of hardware or in the form of a software functional module. The integrated module, if implemented in the form of a software functional module and sold or used as an individual product, may also be stored in a computer readable storage medium.

The storage medium mentioned above may be a read only memory, a magnetic disk, an optical disk, or the like. While the embodiments of the present disclosure have been shown and described above, it is understood that the above-described embodiments are illustrative and are not to be construed as limiting the scope of the disclosure, and changes, modifications, substitutions, and variations may be made by those skilled in the art to the above-described embodiments within the scope of the present disclosure.

What is claimed is:

1. A method for adjusting a passband width of a filter, the method comprising:
   determining an initial passband width;
   controlling the filter according to the initial passband width to filter signals to be processed; and
   correcting the initial passband width according to a first frequency at which a peak spectrum line corresponding to the filtered signals is located.

2. The method according to claim 1, wherein correcting the initial passband width comprises:
   determining a center frequency of the corrected passband according to the first frequency; or
   filtering the signals to be processed again with a new initial passband width, wherein the initial passband width and the new initial passband width do not have an overlapped bandwidth region.

3. An apparatus for adjusting a passband width of a filter, the apparatus comprising;
   at least one processor; and
   a memory coupled to the at least one processor and storing computer program instructions, wherein the computer program instructions, when executed by the at least one processor, cause the apparatus to implement the method according to claim 1.

4. The method according to claim 1, further comprising:
   filtering the signals to be processed with the corrected passband width, and in response to determining that a second frequency at which the peak spectrum line corresponding to the filtered signals is located is different from the first frequency, correcting the center frequency of the corrected passband according to the second frequency.

5. The apparatus according to claim 3, wherein the computer program instructions, when executed by the at least one processor, cause the apparatus to implement the method according to claim 4.

6. The method according to claim 1, wherein controlling the filter according to the initial passband width to filter the signals to be processed comprises:
   determining a target frequency pin of the filter according to the initial passband width; and
   enabling the target frequency pin, such that the filter operate at the initial passband width.

7. The method according to claim 6, wherein enabling the target frequency pin comprises:
   enabling the target frequency pin of the filter through a target interface, corresponding to the target frequency pin, in a bus extender.

8. The apparatus according to claim 3, wherein the computer program instructions, when executed by the at least one processor, cause the apparatus to implement the method according to claim 7.

9. The apparatus according to claim 3, wherein the computer program instructions, when executed by the at least one processor, cause the apparatus to implement the method according to claim 6.

10. The apparatus according to claim 3, wherein the computer program instructions, when executed by the at least one processor, cause the apparatus to implement the method according to claim 2.

11. A device for adjusting a passband width of a filter, the device comprising a filter and a controller, wherein the controller is configured to:
  determine an initial passband width;
  control the filter according to the initial passband width, to filter signals to be processed; and
  correct the initial passband width according to a first frequency at which a peak spectrum line corresponding to the filtered signals is located.

12. The device according to claim 11, wherein the controller is further configured to:
  determine a center frequency of the corrected passband according to the first frequency; or filter the signals to be processed again with a new initial passband width, wherein the initial passband width and the new initial passband width do not have an overlapped bandwidth region.

13. The device according to claim 11, wherein the controller is further configured to:
  filter the signals to be processed with the corrected passband width, and in response to determining that a second frequency at which the peak spectrum line corresponding to the filtered signals is located is different from the first frequency, correct the center frequency of the corrected passband according to the second frequency.

14. The device according to claim 11, wherein the controller is further configured to:
  determine a target frequency pin of the filter according to the initial passband width; and
  enable the target frequency pin, such that the filter operates at the initial passband width.

15. The device according to claim 14, wherein the device further comprises a bus extender, wherein the controller is further configured to enable the target frequency pin of the filter by turning on a target interface, corresponding to the target frequency pin, in the bus extender.

* * * * *